(12) United States Patent
Schweers et al.

(10) Patent No.: US 6,320,755 B1
(45) Date of Patent: Nov. 20, 2001

(54) RETENTION MECHANISM FOR TALL PCB COMPONENTS

(75) Inventors: Michael R. Schweers; William J. Hill, both of Hillsboro; Richard Platt, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/370,103

(22) Filed: Aug. 6, 1999

(51) Int. Cl.⁷ ............................................. H05K 7/02
(52) U.S. Cl. ..................... 361/760; 361/807; 174/136; 174/35 R
(58) Field of Search .................... 361/760, 761, 361/763, 764, 803, 822, 719, 824, 718, 821, 717, 807, 738, 808, 782, 809, 714, 810, 715, 811; 174/35 R, 72, 136, 261, 260, 65, 252, 52.1, 52.2, 52.3, 52.4; 428/920, 921

(56) References Cited

U.S. PATENT DOCUMENTS

| | | | |
|---|---|---|---|
| 3,465,874 | * 9/1969 | Hugle et al. | 206/56 |
| 3,579,811 | * 5/1971 | Matsuo | 29/570 |
| 3,825,999 | * 7/1974 | Rubey | 29/626 |
| 4,583,641 | * 4/1986 | Belzer | 206/330 |
| 4,658,327 | * 4/1987 | Hernandez | 361/306 |
| 5,010,447 | * 4/1991 | Wallace | 361/400 |
| 5,453,581 | * 9/1995 | Liebman et al. | 174/261 |
| 5,612,512 | * 3/1997 | Wakamatsu | 174/260 |
| 5,687,109 | * 11/1997 | Protigal et al. | 365/63 |
| 5,973,928 | * 10/1999 | Blasi et al. | 361/760 |

* cited by examiner

Primary Examiner—Jeffrey Gaffin
Assistant Examiner—Hung Bui
(74) Attorney, Agent, or Firm—Mark V. Seeley

(57) ABSTRACT

An improved assembly for a computer that includes at least two through hole mounted components, which are mounted to a printed circuit board, and a heat resistant strip mounted to the top of each of those components.

11 Claims, 1 Drawing Sheet

RETENTION MECHANISM FOR TALL PCB COMPONENTS

FIELD OF THE INVENTION

The present invention relates to an apparatus for stabilizing components mounted onto printed circuit boards.

BACKGROUND OF THE INVENTION

Printed circuit boards ("PCBs") frequently contain various through hole mounted components. When such components' height exceeds their width, they may be vulnerable to shock and vibration, which may occur when the PCB is manufactured or shipped. Such stresses can damage or dislodge the components.

Tall capacitors, which may be mounted onto PCBs for use in a variety of applications, are particularly susceptible to this type of jarring action. Consequently, a retention mechanism may be required to hold such capacitors in place. Retention covers, which blanket the capacitors and are connected to the PCB, are cumbersome to assemble. Moreover, because of thermal considerations, they generally cannot be placed onto the PCB until after the components are soldered onto the boards. As a result, such covers are not used to stabilize the components as the board moves through the manufacturing process. In addition, using such covers can significantly increase the cost of tooling a new board, and the cost of the covers themselves is not insignificant. These retention covers also require keep out zones that increases board size.

Accordingly, there is a need for a cost effective way to enhance through hole mounted components' resistance to shock and vibration. There is a need for an apparatus that can provide that function, which is easy to assemble and to modify for use in different applications, and which does not require PCB real estate to accommodate. Furthermore, there is a need for a mechanism for stabilizing through hole mounted components during the manufacturing process, e.g., for stabilizing them prior to any solder application steps. The present invention provides such an apparatus.

SUMMARY OF THE INVENTION

The present invention covers an assembly for a computer. That assembly includes at least two through hole mounted components, which are mounted to a printed circuit board, and a heat resistant strip mounted to the top of each of those components.

DETAILED DESCRIPTION OF THE PRESENT INVENTION

Figure 1:
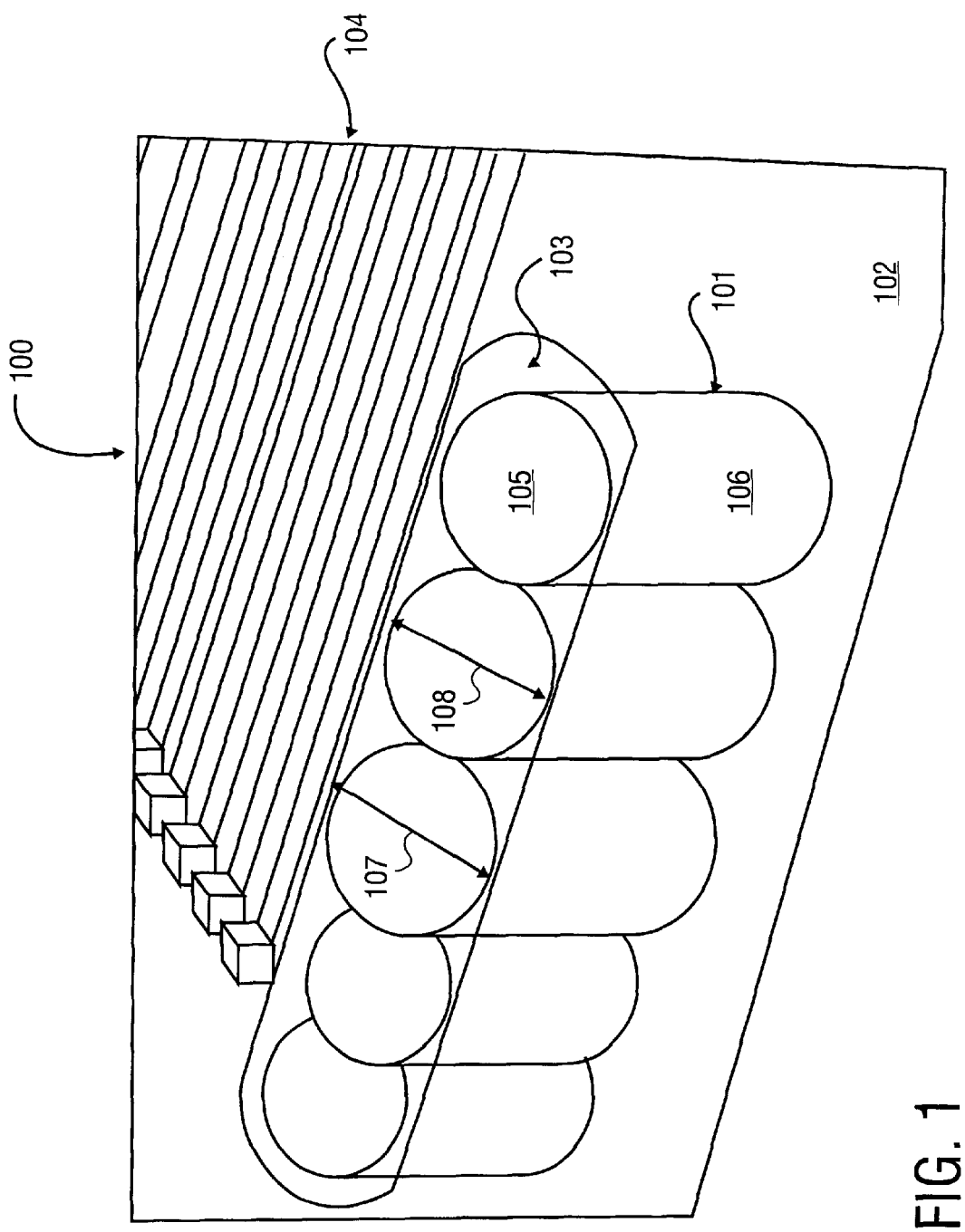
FIG. 1 is a perspective view of an embodiment of the assembly for a computer of the present invention.

An assembly for a computer is described. In the following description, specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

As shown in FIG. 1, the assembly for a computer 100 of the present invention comprises through hole mounted components 101, which are mounted to a printed circuit board ("PCB") 102. A heat resistant strip 103 is mounted to the top of each of the through hole mounted components 101. In the embodiment shown in FIG. 1, PCB 102 provides the foundation for a memory card, which includes memory card slots 104 in addition to components 101 and strip 103. Such a memory card may be used in a server. Other components typically mounted onto PCB 102 to form such a memory card are not shown so as not to obscure the invention.

In the embodiment shown in FIG. 1, through hole mounted components 101 are capacitors. "Through hole mounted component," as that phrase is used herein, refers to a component that is connected to a PCB by inserting part of it through a hole formed in the PCB, then solder welding it, or otherwise attaching it, to the PCB. This type of component differs from one that is surface mounted on the PCB. Capacitors like those shown attached to PCB 102 in FIG. 1 are conventionally used with motherboards, memory cards, and similar types of assemblies, as is well known to those skilled in the art.

Strip 103 attaches to top surface 105 of capacitors 101. Strip 103 connects capacitors 101 together to form a unit that is more resistant to the type of shocks and vibrations that may impact assembly 100, when manufactured or during shipping. Strip 103 includes an adhesive on the side that contacts capacitors 101. That adhesive preferably is strong enough to bind the strip to the capacitors during manufacturing and shipping of the assembly, but weak enough to enable removal of the strip from the capacitors without damaging the capacitors or the printed circuit board.

Use of such an adhesive enables strip 103 to protect capacitors 101, when such protection is most needed, while permitting removal, if necessary (such as to remove/repair underlying components), after assembly 100 reaches it final destination. If strip 103 is removed from assembly 100, and assembly 100 will be subsequently moved, it may be desirable to stabilize capacitors 101 beforehand. In that case, strip 103 can, of course, again be placed on capacitors 101 prior to moving assembly 100.

In the embodiment shown in FIG. 1, strip 103 is substantially planar such that it does not include edges that extend along sides 106 of capacitors 101. Strip 103 preferably is fire resistant in addition to being heat resistant. Strip 103 may be made from various amorphous engineering thermoplastics that provide high levels of mechanical, optical, electrical and thermal properties. Materials having a UV rating of 0 are particularly suitable for making strip 103, such as those sold by General Electric Company under the name LEXAN®. Although such materials are preferred, any material that may form a rigid or semi-rigid strip that may be attached to capacitors 101 falls within the spirit and scope of the present invention.

As shown in FIG. 1, width 107 of strip 103 preferably exceeds width 108 of capacitors 101. Strip 103 preferably is less than about 1 0mm thick, and more preferably between about 0.2 and 1 mm thick. Strip 103 may comprise a transparent thin piece of plastic with adhesive on one side. Using a transparent material for strip 103 enables viewing of the underlying components, e.g., to check for defects, without having to remove strip 103. The adhesive applied to strip 103 preferably should have a relatively high flash point. Suitable adhesives may be obtained from a number of vendors, including, for example, the Minnesota Mining and Manufacturing Company (a.k.a. "3M"), as will be apparent to those skilled in the art.

Although shown in the context of stabilizing capacitors included on a memory card for a server, strip 103 may be molded, formed or cut as necessary to stabilize a variety of through hole mounted components that may be attached to various types of PCBs and assembled in various ways. To optimally use strip 103 for this purpose, capacitors 101 (or other relatively tall through hole mounted components) should preferably be placed onto PCB 102 in close proximity, e.g., in the substantially linear fashion shown in FIG. 1. By arranging capacitors 101 on PCB 102 in this way, then joining them with strip 103, each individual capacitor cannot easily move in a direction parallel to the plane where they line up on PCB 102. And by arranging them in this way, then joining them together with strip 103, the base of support for capacitors 101 is effectively broadened, which increases each capacitor's resistance to jarring forces applied perpendicular to that plane.

The present invention may be particularly useful when the through hole mounted components attached to the PCB have height to width ratios that exceed 1—even more so when that ratio exceeds 2. Moreover, assemblies that include capacitors having leads that are at least about 0.6 mm in diameter may particularly benefit.

The method for making the claimed assembly is relatively straightforward. First, holes are formed within a printed circuit board for receiving at least two through hole mounted capacitors. Those capacitors' leads are then inserted through those holes. These steps may be performed in the conventional manner. The heat resistant strip is then fixed to the top of each of the capacitors. Afterwards, the gap between the leads and the holes is filled with solder to secure the capacitors to the printed circuit boards, using conventional materials and process steps. Although the assembly of the present invention preferably should be formed by first applying the strip and then the solder, those skilled in the art will appreciate that the soldering step may instead precede the strip application step.

An improved assembly for a computer has been described. This assembly may be easily manufactured in a very cost effective manner. In addition, keep out zones are not required to accommodate it, nor does it require significant effort to modify assembly designs for use in different applications. Also, the assembly may be configured either before or after solder is applied to the relatively tall through hole mounted components that are included in it.

Features shown in the above referenced drawing are not intended to be drawn to scale, nor are they intended to be shown in precise positional relationship. As indicated above, additional components that may be mounted onto the PCB have been omitted as they are not useful to describe aspects of the present invention.

Although the foregoing description has specified an assembly for a computer that includes certain features, those skilled in the art will appreciate that many modifications and substitutions may be made. For example, although the embodiments described above relate to capacitors, the assembly of the present invention may instead include other types of relatively tall through hole mounted components. Accordingly, it is intended that all such modifications, alterations, substitutions and additions be considered to fall within the spirit and scope of the invention as defined by the appended claims.

What is claimed is:

1. An assembly for a computer comprising:

at least two through hole mounted components having a height to width ratio that exceeds 2, which are mounted to a printed circuit board; and a rigid heat resistant strip mounted to the top of each of those components.

2. The assembly of claim 1 wherein the components are through hole mounted capacitors.

3. The assembly of claim 2 wherein the strip comprises a fire resistant plastic material having a high flash point adhesive applied to the side that contacts the capacitors.

4. The assembly of claim 3 wherein the adhesive is strong enough to bind the strip to the capacitors during manufacturing and shipping of the assembly, but weak enough to enable removal of the strip from the capacitors without damaging the capacitors or the printed circuit board.

5. The assembly of claim 4 wherein the strip is substantially planar such that it does not include edges which extend along the sides of the capacitors.

6. An assembly for a computer comprising:

at least two through hole mounted capacitors, which are mounted to a printed circuit board; and a rigid fire resistant plastic strip attached to the top of each of those capacitors by an adhesive material applied to the plastic strip, wherein the strip width exceeds the width of the capacitors and the strip thickness is less than about 10 mm.

7. The assembly of claim 6 wherein at least three capacitors are mounted to the printed circuit board in a substantially linear fashion.

8. The assembly of claim 7 wherein the strip thickness is between about 0.2 mm and about 1 mm.

9. The assembly of claim 8 wherein the capacitors each have leads that are at least about 0.6 mm in diameter.

10. A memory card for a server comprising:

at least three through hole mounted capacitors, which are mounted to the memory card in a substantially linear fashion, each of the capacitors' height to width ratio exceeding 2, and the capacitors each having leads that are at least about 0.6 mm in diameter; and a rigid fire resistant plastic strip attached to the top of each of those capacitors by an adhesive material applied to the plastic strip.

11. The memory card of claim 10 wherein the adhesive is strong enough to bind the strip to the capacitors during manufacturing and shipping of the printed circuit board, but weak enough to enable removal of the strip from the capacitors without damaging the capacitors or the printed circuit board, and wherein the strip width exceeds the width of the capacitors and the strip thickness is less than about 10 mm, and the strip is substantially planar such that it does not include edges which extend along the sides of the capacitors.

* * * * *